United States Patent
Inokuchi et al.

(10) Patent No.: US 12,359,029 B2
(45) Date of Patent: Jul. 15, 2025

(54) EPOXY-MODIFIED SILICONE FINE PARTICLE, A METHOD FOR PREPARING THE SAME, A THERMOSETTING RESIN COMPOSITION COMPRISING THE FINE PARTICLES AND AN ENCAPSULATING MATERIAL

(71) Applicants: SHIN-ETSU CHEMICAL CO., LTD., Tokyo (JP); NISSIN CHEMICAL INDUSTRY CO., LTD., Echizen (JP)

(72) Inventors: Yoshinori Inokuchi, Annaka (JP); Mio Sakai, Echizen (JP)

(73) Assignees: SHIN-ETSU CHEMICAL CO., LTD., Tokyo (JP); NISSIN CHEMICAL INDUSTRY CO., LTD., Echizen (JP)

(*) Notice: Subject to any disclaimer, the term of this patent is extended or adjusted under 35 U.S.C. 154(b) by 570 days.

(21) Appl. No.: 17/774,899

(22) PCT Filed: Oct. 29, 2020

(86) PCT No.: PCT/JP2020/040578
§ 371 (c)(1),
(2) Date: May 6, 2022

(87) PCT Pub. No.: WO2021/090752
PCT Pub. Date: May 14, 2021

(65) Prior Publication Data
US 2023/0002563 A1     Jan. 5, 2023

(30) Foreign Application Priority Data
Nov. 7, 2019   (JP) ................................ 2019-202357

(51) Int. Cl.
    *C08J 3/12*        (2006.01)
    *C08G 77/38*     (2006.01)
    *H01L 23/29*     (2006.01)

(52) U.S. Cl.
    CPC .............. *C08J 3/126* (2013.01); *C08G 77/38* (2013.01); *H01L 23/295* (2013.01); *C08J 2383/04* (2013.01); *C08J 2483/06* (2013.01)

(58) Field of Classification Search
    CPC ................... C08J 3/126; H01L 33/56
    USPC .................................................. 428/403, 407
    See application file for complete search history.

(56) References Cited

U.S. PATENT DOCUMENTS

2007/0015884 A1    1/2007   Yamamoto et al.
2022/0073684 A1*   3/2022   Wakita ................... C08G 77/50

FOREIGN PATENT DOCUMENTS

| EP | 661334 A1 * | 7/1995 | ............. C08J 3/124 |
|---|---|---|---|
| JP | 8-85753 A | 4/1996 | |
| JP | 9-20631 A | 1/1997 | |
| JP | 2007-23061 A | 2/2007 | |
| JP | 2007-146148 A | 6/2007 | |
| JP | 2009-280767 A | 12/2009 | |
| JP | 2014-15522 A | 1/2014 | |
| JP | 2017-110092 A | 6/2017 | |
| JP | 2018-172545 A | 11/2018 | |

OTHER PUBLICATIONS

Extended European Search Report for European Application No. 20885132.9, dated Oct. 30, 2023.
International Search Report, issued in PCT/JP2020/040578, PCT/ISA/210, dated Jan. 19, 2021.
Written Opinion of the International Searching Authority, issued in PCT/JP2020/040578, PCT/ISA/237, dated Jan. 19, 2021.

* cited by examiner

*Primary Examiner* — Marc S Zimmer
(74) *Attorney, Agent, or Firm* — Birch, Stewart, Kolasch & Birch, LLP

(57) ABSTRACT

One of the purposes of the present invention is to provide silicone fine particles which do not aggregate in a thermosetting resin while having softness derived from silicone rubber and have excellent adhesion with the thermosetting resin. The other purpose is to provide a method for preparing the same. The other purpose is to provide a thermosetting resin composition and an encapsulating material, each comprising the fine particles. The present invention provides an epoxy-modified silicone fine particle composed of (A) a spherical silicone rubber fine particle coated with (B) polyorganosilsesquioxane, wherein the spherical silicone rubber fine particle (A) has an average particle diameter of 0.1 to 100 μm and the polyorganosilsesquioxane (B) has an epoxy group-containing organic group.

16 Claims, 3 Drawing Sheets

SEM image with magnification of 5000 times

SEM image with magnification of 10000 times

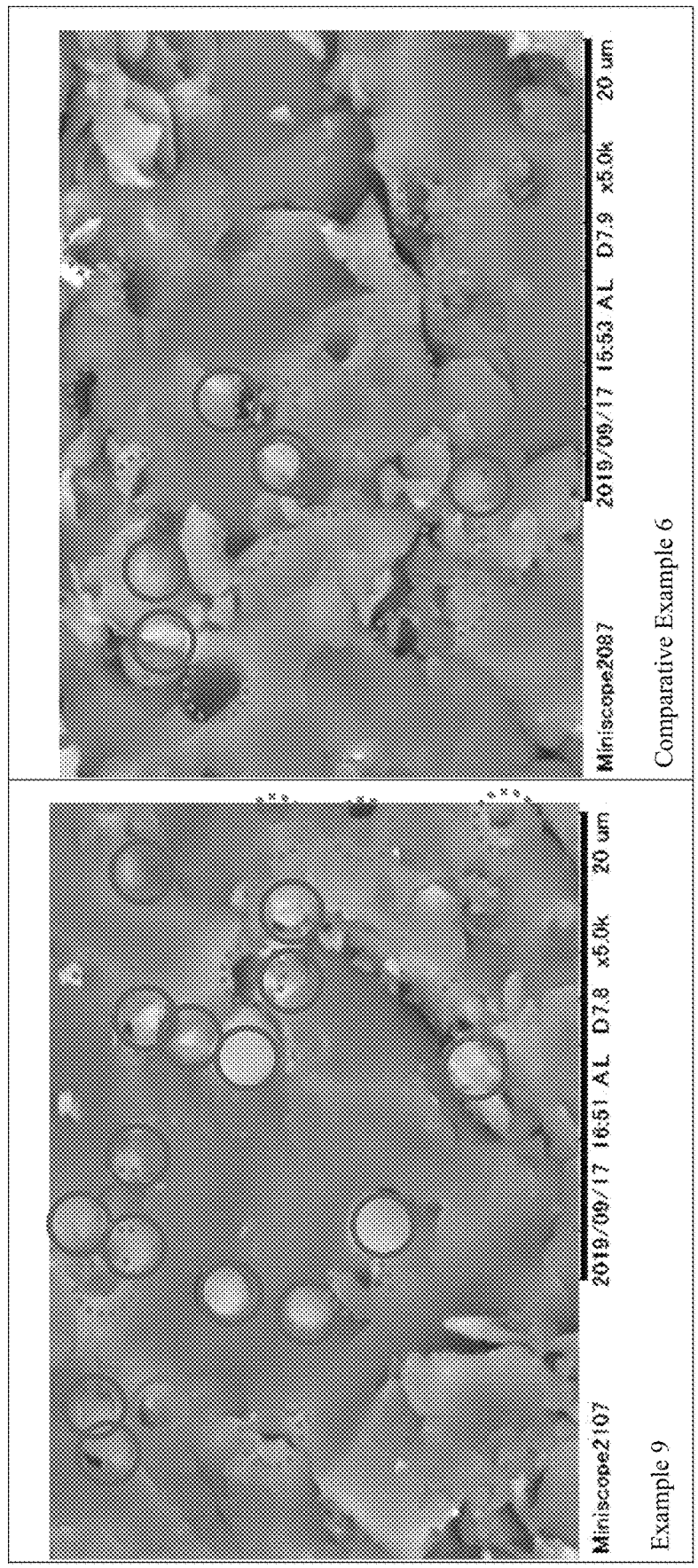

EPOXY-MODIFIED SILICONE FINE PARTICLE, A METHOD FOR PREPARING THE SAME, A THERMOSETTING RESIN COMPOSITION COMPRISING THE FINE PARTICLES AND AN ENCAPSULATING MATERIAL

TECHNICAL FIELD

The present invention relates to an epoxy-modified silicone fine particle, particularly silicone fine particles which do not aggregate in a thermosetting resin and do have softness derived from silicone rubber and excellent adhesion to the thermosetting resin, and a method of preparing the same. The present invention further relates to a thermosetting resin composition and an encapsulating material, each comprising the fine particles.

BACKGROUND OF THE INVENTION

In the field of encapsulating elements of electronic devices such as transistors and ICs, the elements are conventionally encapsulated mainly with a resin from the standpoint of productivity, and costs. An epoxy resin is mainly used as an encapsulating resin because of well-balanced various properties such as electrical properties, humidity resistance, heat resistance, mechanical properties, and adhesion with inserted parts. However, the epoxy resin is hard and fragile. Therefore, for the usage of encapsulation, the epoxy resin itself is modified or an additive having a stress relaxation effect is added to the epoxy resin.

Acrylic rubber, an epoxy-modified silicone oil, an amino-modified silicone oil, and silicone rubber powders are generally known as a stress relaxation additive. The acrylic rubber have no chemical reaction point to react with the epoxy resin and, therefore, does not adhere well with the epoxy resin. The epoxy-modified silicone oil and amino-modified silicone oil have a low molecular weight and, accordingly, have an insufficient stress relaxation effect. The silicone rubber powder has poor compatibility with the epoxy resin and, therefore, are not uniformly dispersed therein.

For example, Japanese Patent Application Laid-Open No. 2007-23061 describes an epoxy resin composition obtained by adding an epoxy-modified low-molecular-weight silicone to an epoxy resin in order to improve fluidity. The epoxy-modified low-molecular-weight silicone has poor compatibility with the epoxy resin and is therefore not easily mixed uniformly with the epoxy resin when a sufficient amount of an epoxy-modified low-molecular-weight silicone is added to attain a stress relaxation effect.

Japanese Patent Application Laid-Open No. 2018-172545 describes a solid encapsulating material which is used for compression molding and comprises an epoxy resin and an epoxy-modified silicone and describes that the solid encapsulating material is excellent in the stability in warpage behavior. However, the stress relaxation effect brought only by these components is insufficient, so that further improvement is required.

Japanese Patent Application Laid-Open No. 2007-146148 describes that a core-shell type silicone compound comprising a silicone oil core and an organic polymer shell such as acrylic resin is added to an epoxy resin and, thereby, the epoxy resin having a reduced modulus of elasticity is obtained. Japanese Patent Application Laid-Open No. Hei 8 (1996)-85753 describes that silicone fine particles obtained by coating a spherical silicone rubber fine particle with an organosilsesquioxane resin are added to an epoxy resin and, thereby, an epoxy resin having improved dispersibility is obtained. However, the shell portion of the acrylic resin or silicone has no chemical bond with the epoxy resin and therefore does not adhere well with the epoxy resin. In addition, the acrylic resin has a Tg not higher than the curing temperature of the epoxy resin, so that the acrylic resin may melt, aggregate to prevent uniform dispersion. Therefore, further improvement is required.

PRIOR LITERATURES

Patent Literatures

Patent Literature 1: Japanese Patent Application Laid-Open No. 2007-23061
Patent Literature 2: Japanese Patent Application Laid-Open No. 2018-172545
Patent Literature 3: Japanese Patent Application Laid-Open No. 2007-146148
Patent Literature 4: Japanese Patent Application Laid-Open No. Hei 8 (1996)-85753

SUMMARY OF THE INVENTION

Problems to be Solved by the Invention

The present invention has been made in the aforesaid circumstances. One of the purposes of the present invention is to provide silicone fine particles which do not aggregate in a thermosetting resin and do have softness derived from silicone rubber and have excellent adhesion with the thermosetting resin. Another purpose is to provide a method for preparing the same. The other purpose is to provide a thermosetting resin composition and an encapsulating material, each comprising the fine particles.

Means for Solving the Problems

The present inventors conducted keen researches to solve the aforesaid problems and have found that epoxy-modified silicone fine particle having a core-shell structure which is obtained by coating spherical silicone rubber fine particle with a polyorganosilsesquioxane having an epoxy group-containing organic group has properties specific to silicone rubber, prevents aggregation and has good dispersibility. Further, since the epoxy-modified silicone fine particles have a chemical reaction point with a thermosetting resin, particularly with an epoxy resin, they have excellent adhesion and bonding property with the resins.

That is, the present invention provides epoxy-modified silicone fine particle composed of (A) a spherical silicone rubber fine particle coated with (B) polyorganosilsesquioxane, wherein the spherical silicone rubber fine particle (A) has an average particle diameter of 0.1 to 100 µm and the polyorganosilsesquioxane (B) has an epoxy group-containing organic group.

The present invention further provides a thermosetting resin composition comprising the epoxy-modified silicone fine particles.

Effects of the Invention

The epoxy-modified silicone fine particle according to the present invention has softness derived from silicone rubber. The epoxy-modified silicone fine particle does not aggregate in a thermosetting resin, particularly an epoxy resin and, therefore, has excellent dispersibility. In addition, the epoxy-modified silicone fine particle is excellent in adhesion with a thermosetting resin, particularly an epoxy resin. Further, the present invention provides a thermosetting resin composition and an encapsulating material which comprises the epoxy-modified silicone fine particles and provides a cured product excellent in mechanical properties such as bending strength and bending modulus of elasticity.

BRIEF DESCRIPTION OF THE DRAWINGS

FIG. 3 is an enlarged image of the SEM image of Example 9 and Comparative Example 6.

DETAILED DESCRIPTION OF THE INVENTION

Figure 1:
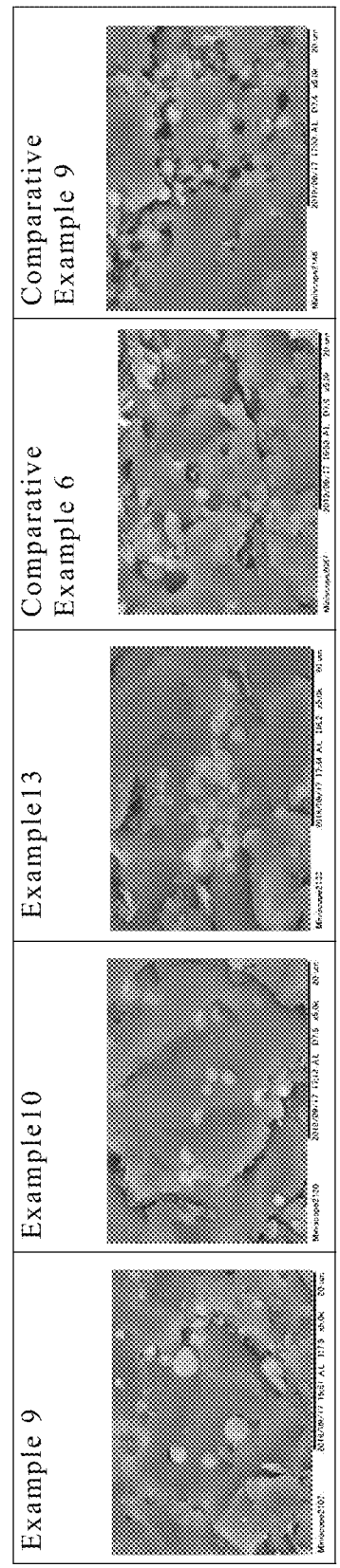
FIG. 1 is an SEM image of the cross-section of a cured product obtained in Examples 9, 10, and 13 and Comparative Examples 6 and 9.

The present invention will be explained below in more detail.

The present epoxy-modified silicone fine particle has a core-shell structure which is composed of (A) a spherical silicone rubber fine particle coated with (B) polyorganosilsesquioxane, wherein the spherical silicone rubber fine particle (A) has an average particle diameter of 0.1 to 100 μm and the polyorganosilsesquioxane (B) has an epoxy group-containing organic group.

The silicone rubber (A) of the spherical silicone rubber fine particle has a linear organopolysiloxane block represented by the following formula (1) in the molecular structural and comprises a spherical silicone cured product having rubber elasticity.

$$—(R^1_2SiO)_a—\quad (1)$$

In the aforesaid formula (1), $R^1$ is a substituted or unsubstituted monovalent hydrocarbon group having 1 to 20 carbon atoms or groups selected from an organic group having a reactive group such as epoxy, amino, mercapto, acryloxy, and methacryloxy groups. Examples of the monovalent hydrocarbon group having 1 to 20 carbon atoms include alkyl groups such as methyl, ethyl, propyl, and butyl groups, aryl groups such as phenyl and tolyl groups, alkenyl groups such as vinyl and allyl groups, and aralkyl groups such as β-phenylethyl and β-phenylpropyl group. Examples of the substituted group include groups wherein a part or all of the hydrogen atoms bonded to a carbon atom of the aforesaid hydrocarbon groups is substituted with a halogen atom, such as monovalent halogenated hydrocarbon groups such as chloromethyl and 3,3,3-trifluoropropyl groups. Preferably, 90 mol % or more of $R^1$ is preferably a methyl group.

In the aforesaid formula (1), "a" is an integer of 5 to 5000, preferably an integer of 10 to 1,000. If "a" is less than 5, the effect obtained from the linear organopolysiloxane is not sufficient and an internal stress relaxation effect is not fully obtained. Although the upper limit may be not particular, when "a" is over 5,000, preparation of the silicone rubber fine particles is actually difficult.

The spherical silicone rubber fine particle may contain, in the particles thereof, a silicone oil, an organosilane, an inorganic powder, or an organic powder. The spherical silicone rubber fine particle is required to have an average particle diameter of 0.1 to 100 μm, preferably in a range of 1 to 30 μm. If the average particle diameter of the spherical silicone rubber fine particle is smaller than the aforesaid lower limit, the fluidity of the particles may be lower and the aggregation may be higher. If the average particle diameter is larger than the aforesaid upper limit, the properties of a base material may be damaged. The average particle diameter in the present invention is a volume-based average particle diameter determined by a laser diffraction type particle diameter distribution analyzer.

Examples of a method for preparing the spherical silicone rubber fine particle include a condensation reaction between a methoxysilyl group (≡SiOCH$_3$) and a hydroxysilyl group (≡SiOH), a radical reaction between a mercaptosilyl group (≡SiSH) and a vinylsilyl group (≡SiCH=CH$_2$), and an addition reaction between a vinylsilyl group (≡SiCH=CH$_2$) and a ≡SiH group. Preparation by the addition reaction is preferred from the standpoint of reactivity and a reaction step. For example, preferred is the addition reactive composition in which (a) a vinyl group-containing organopolysiloxane reacts with (b) an organohydrogenpolysiloxane in the presence of (c) a platinum type catalyst and followed by cures.

The aforesaid component (a) is a main component of an organopolysiloxane constituting the spherical silicone rubber fine particle and addition-reacts with component (b) to cure by the catalytic action of component (c). Component (a) is required to have at least two vinyl groups bonded to a silicon atom per molecule. The vinyl groups may be present at any portion of the molecule and are preferably present at least at the end of the molecule. Examples of the organic group bonded to a silicon atom, other than a vinyl group, include groups as the aforesaid groups defined for $R^1$. Preferably, 90 mol % or more of the organic groups are a methyl group. The vinyl group-containing organopolysiloxane (a) may have any of a linear molecular structure and a branched molecular structure. A mixture of the linear one and the branched one may be used. The molecular weight is not particularly limited, but the organopolysiloxane preferably has a viscosity at 25° C. of 1 cP or more to obtain a cured product having rubbery elasticity.

Examples of component (a) include linear, cyclic and branched organopolysiloxanes represented by the following formulas.

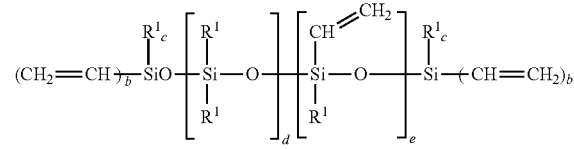

wherein b and c are an integer of from 0 to 3 which meets equation b+c=3, d is a positive number, e is 0 or a positive number and meets equation 2b+e≥2,

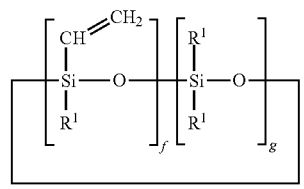

wherein f is a positive number of 2 or more, g is 0 or a positive number, and f+g is 4 to 8,

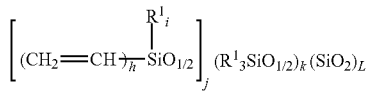

wherein h is 1, 2 or 3, i is 0, 1 or 2, h+i=3 and j, k and L are a positive number.

Component (b) is a crosslinking agent of component (a). A hydrogen atom bonded to the silicon atom in component (b) (hereinafter referred to as "hydrosilyl group") addition-reacts with the vinyl group in component (a) to be cured in the presence of the catalyst (c). Component (b) is therefore required to have at least two hydrogen atoms bonded to the silicon atom in one molecule. In addition to the hydrogen atom, an organic group to be bonded to the silicon atom may be a group selected from the monovalent organic groups defined for the aforesaid Preferably, 90 mol % or more of the total mol of the organic groups bonded to the silicon atom is a methyl group. The molecular structure of component (b) is not particularly limited and may be any of linear, branched, and cyclic. A mixture of organohydrogensiloxanes having linear, branched, or cyclic structure may be used. The molecular weight is also not particularly limited. Component (b) preferably has a viscosity at 25° C. of 1 to 10,000 cP to have good compatibility with component (a).

The amount of component (b) is such that a ratio of the number of the hydrosilyl group in component (b) to the number of the vinyl group in component (a) may be 0.5 to 20, preferably 0.5 to 5. If the amount of component (b) is less than the aforesaid lower limit, good curability is hard to be achieved. If the amount of component (b) is more than the aforesaid upper limit, the physical properties of the rubber after curing are lower, which is not preferred.

Examples of component (b) include linear, cyclic or branched polyorganohydrogensiloxane represented by the following formulas.

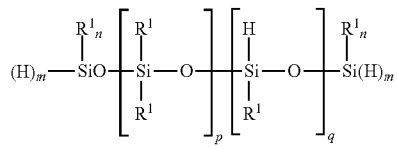

wherein m is 0 or 1, n is 2 or 3, m and n meet equation m+n=3, p is 0 or a positive number, q is 0 or a positive number and m and q meet equation 2m+q≥2,

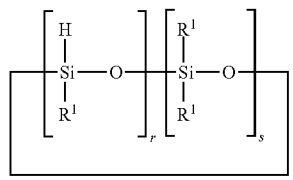

wherein r is a positive number of 2 or more, s is 0 or a positive number and a total number of r and s is 4 to 8,

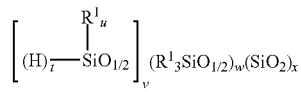

wherein t is 1, 2 or 3, u is 0, 1 or 2 and a total number of t and u is 3, v, w and x are a positive number.

Component (c) is a catalyst for promoting the addition reaction between the vinyl group bonded to the silicon atom of component (a) and the hydrosilyl group of component (b) and may be selected from any known addition reaction catalysts. Examples of the catalyst include platinum group catalysts such as platinum supported on carbon or silica, chloroplatinic acid, platinum-olefin complexes, platinum-alcohol complexes, platinum-phosphorus complexes, platinum-vinyl group-containing siloxane complexes, and platinum coordination compounds.

The amount of component (c) may be a catalytic amount sufficient to promote the aforesaid addition reaction and is such that the amount of a platinum atom relative to the aforesaid component (a) is preferably in a range of 1 to 100 ppm. If the amount is less than 1 ppm, curing rate slows and the catalyst is likely to be affected by a catalyst poison. Even if the amount is more than 100 ppm, improvement particularly in curing rate cannot be expected, which is not preferred from the standpoint of economy.

The spherical silicone rubber fine particle is obtained, for example, by reacting the aforesaid component (a) with component (b) in the presence of component (c) and thereby curing them. More specifically, examples of the preparation method include a method of curing component (a) and component (b) in a high-temperature spray dry, a method of curing them in an organic solvent, and a method of preparing an emulsion of components (a) to (c) and then curing the resulting emulsion. Among them, the method of curing the silicone in an emulsion is most preferred, because an aqueous dispersion of spherical silicone rubber fine particle is used in the method of preparing silicone fine particles according to the present invention which will be described below.

Examples of the method of curing the aforesaid silicone in an emulsion include a method of mixing predetermined amounts of the vinyl group-containing organopolysiloxane (a) and the organohydrogenpolysiloxane (b) to prepare an organopolysiloxane composition, adding water and a surfactant to the resulting composition, and emulsifying the resulting mixture with a commercially available homomixer.

The surfactant is preferably a nonionic surfactant having a less adverse effect on the curing reaction such as a polyoxyethylene alkyl phenyl ether, a polyoxyethylene alkyl ether, a polyoxyethylene sorbitan fatty acid ester, or a glycerin fatty acid ester. The amount of the surfactant is preferably 0.01 to 20 parts by mass, more preferably 0.05 to 10 parts by mass, relative to 100 parts by mass of the emulsion. If the amount is less than the aforesaid lower limit, fine particles are not obtained. If the amount is more than the aforesaid upper limit, coating the surface of the silicone fine particles with a polyorganosilsesquioxane is difficult when the aqueous dispersion is used in the preparation method described below.

The total amount of the aforesaid components (a) and (b) in the emulsion is preferably 1 to 80 parts by mass, more preferably 10 to 60 parts by mass in 100 parts by mass of the emulsion. The amount less than the aforesaid lower limit is disadvantageous in efficiency. If the amount is more than the aforesaid upper limit, an emulsion of independent cured particles may not be obtained. In addition, a ratio of a to b (a/b) is preferably adjusted to 0.5 to 15, more preferably 1 to 10. When a silicone oil, silane, an inorganic powder, or an organic powder is incorporated in the spherical silicone rubber fine particle, they may be mixed in the organopolysiloxane composition in advance and then, the resulting mixture may be emulsified.

The platinum group catalyst (c) is added to cure the aforesaid organopolysiloxane and thereby obtain a dispersion of a cured product of the silicone rubber. As the platinum group catalyst, a known reaction controlling agent may be added. When the platinum group catalyst and the reaction controlling agent are not easily dispersed in water, they may be added after being made dispersible in water by a surfactant. An aqueous dispersion of the spherical silicone rubber fine particle having an average particle diameter of 0.1 to 100 μm (A) is thus obtained.

The silicone fine particle of the present invention is characterized in that the aforesaid spherical silicone rubber fine particle is coated with the epoxy group-containing polyorganosilsesquioxane (B) and the polyorganosilsesquioxane has an epoxy group-containing organic group. The epoxy group-containing polyorganosilsesquioxane (B) may be uniformly coated on the entire surface or may be coated on partial surface of the spherical silicone rubber fine particle. The amount of the epoxy group-containing polyorganosilsesquioxane is preferably 1 to 500 parts by mass, more preferably 5 to 100 parts by mass, relative to 100 parts by mass of the spherical silicone rubber fine particle. If the amount of the polyorganosilsesquioxane is less than the aforesaid lower limit, the resulting silicone fine particles may have poor fluidity, dispersibility, and compatibility with the base material. If the amount is more than the aforesaid upper limit, the properties of the spherical silicone rubber fine particle is not satisfactory exhibit. The organic group of the polyorganosilsesquioxane bound to the silicon atom, besides the epoxy group-containing organic group, is preferably an alkyl group such as a methyl, ethyl or propyl group and a methyl group is particularly preferred.

The epoxy group-containing organic group is not particularly limited. Examples of the epoxy group-containing organic group include an epoxy group, a glycidyl ether group, a glycidyl ester group, a glycidyl amino group, and a group obtained by binding the aforesaid groups to a substituted or unsubstituted alkyl group having 1 to 20 carbon atoms. Preferred examples of the epoxy group-containing organic group include 3-glycidoxypropyltrimethoxysilane, 3-glycidoxypropyltriethoxysilane, and (2-(3,4-epoxycyclohexyl)ethyltrimethoxysilane. An alicyclic epoxy group may also be used.

The epoxy group-containing organic group (B) is preferably an alicyclic hydrocarbon group having an epoxy group, particularly any of the groups represented by the following formulas (2) to (5).

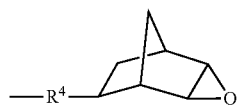

(2)

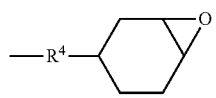

(3)

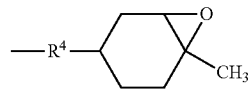

(4)

(5)

In each of the formulas, $R^4$ is, independently of each other, a single bond or a divalent hydrocarbon group having 1 to 6 carbon atoms, preferably a divalent hydrocarbon group having 2 to 4 carbon atoms. The epoxy equivalent of the epoxy-modified silicone fine particle is not particularly limited. The epoxy equivalent on the surface of the particles is preferably 2000 to 100000 g/mol from the standpoint of compatibility and adhesion with an epoxy resin. The epoxy equivalent is determined by potentiometric titration.

Preparation Method

The silicone fine particles of the present invention are obtained by a preparation method including a step of adding an alkaline substance or an alkaline aqueous solution and a mixture of (b1) an organotrialkoxysilane and (b2) an epoxytrialkoxysilane to an aqueous dispersion of the spherical silicone rubber fine particles having an average particle diameter of 0.1 to 100 μm and then causing hydrolysis and condensation reactions of components (b1) and (b2). The aqueous dispersion of the spherical silicone rubber fine particle may be such that the aqueous dispersion prepared by the aforesaid method as is or the aqueous dispersion further diluted with water. The amount of the silicone rubber fine particles contained in 100 parts by mass of the aqueous dispersion of the spherical silicone rubber fine particle is preferably 1 to 60 parts by mass, more preferably 5 to 40 parts by mass. If the amount of the silicone rubber fine particles is less than the aforesaid lower limit, a preparation efficiency of intended silicone fine particles is lower. If the amount is more than the aforesaid upper limit, coating of the spherical silicone rubber fine particle with the epoxy group-containing polyorganosilsesquioxane is difficult and aggregation and fusion bonding of the particles sometimes occur, which is not preferred.

A surfactant may be added to the aqueous dispersion of the spherical silicone rubber fine particles. Adding the surfactant makes it possible to enhance the dispersibility of the silicone spherical fine particles contained in the aqueous dispersion. The surface of the spherical silicone rubber fine particle is uniformly coated with the epoxy group-containing polyorganosilsesquioxane which will be described below in detail. The type of the surfactant is not particularly limited and may be selected from known ones. Examples of the surfactant include cationic surfactants such as quaternary ammonium salts and alkylamine salts, amphoteric surfactants such as alkyl betaines, nonionic surfactants such as polyoxyethylene alkyl ethers, polyoxyethylene alkyl phenyl ethers, sorbitan fatty acid esters, and glycerin fatty acid esters, and anionic surfactants such as organic sulfonates and alkyl sulfate ester salts. They may be used either alone or in combination thereof.

The alkaline substance or alkaline aqueous solution to be added to the aqueous dispersion of the spherical silicone rubber fine particles functions to promote the hydrolysis and condensation between (b1) an organotrialkoxysilane and (b2) an epoxytrialkoxysilane. The alkaline substance and alkaline aqueous solution preferably have a pH in a range of 9.5 to 13.8, particularly preferably in a range of 11.5 to 13.5. If the pH is less than the aforesaid lower limit, the hydrolysis and condensation of a mixture of the organotrialkoxysilane (b1) and the epoxytrialkoxysilane (b2) do not sufficiently proceed and therefore, fusion bonding between particles may occur, which is not preferred. If the pH is more than the aforesaid upper limit, a rate of the hydrolysis of the organotrialkoxysilane with the epoxytrialkoxysilane increases to cause a hydrolysis reaction at a portion of the silicone rubber fine particles besides the surface, which may make it difficult to efficiently prepare a polyorganosilsesquioxane on the surface of the silicone rubber fine particles. In the present preparation method, the pH is required to be set higher than that, for example, in the reaction of only a methyltrialkoxysilane, because the hydrolysis and condensation of the epoxytrialkoxysilane proceed slowly.

Any alkaline substance or alkaline aqueous solution is usable as far as it has a catalytic action on the hydrolysis and condensation reactions of the organotrialkoxysilane and the epoxytrialkoxysilane. For instance, may be used, alkali metal hydroxides such as potassium hydroxide, sodium hydroxide, and lithium hydroxide, alkaline earth metal hydroxides such as calcium hydroxide and barium hydroxide, alkali metal carbonates such as potassium carbonate and sodium carbonate, ammonia or amines such as monomethylamine, dimethylamine, monoethylamine, diethylamine, and ethylenediamine, and quaternary ammonium hydroxides such as tetramethylammonium hydroxide. Among them, ammonia is most preferable because it is excellent in solubility in water and catalytic activity and can be removed easily from powders by volatilization. A commercially available aqueous ammonia (having a concentration of 25 wt %) may be used. The amount of the aqueous ammonia is preferably 80 to 1000 parts by mass, more preferably 200 to 800 parts by mass, as calculated as a 25% solution of ammonia in water, relative to 100 parts by mass of the silane compounds (total of the aforesaid (b1) and (b2)). If the amount of ammonia is small, the silicone rubber particles may fail to be coated and homo particles of silane may be formed.

As described above, the organotrialkoxysilane (b1) and the epoxytrialkoxysilane (b2) are subjected to the hydrolysis and condensation reactions to form an epoxy group-containing polyorganosilsesquioxane on the surface of the spherical silicone rubber fine particle (A). The organotrialkoxysilane (b1) is represented by the following formula (3):

$$R^2Si(OR^3)_3 \quad (3)$$

In the aforesaid formula (3), $R^2$ is a monovalent hydrocarbon group having 1 to 20 carbon atoms and examples of $R^2$ include the monovalent hydrocarbon groups defined for the $R^1$, and preferably alkyl groups having 1 to 10 carbon atoms, further preferably having 1 to 5 carbon atoms. $R^3$ is an alkyl group having 1 to 6 carbon atoms such as a methyl, ethyl, propyl, or butyl group.

Examples of the organotrialkoxysilane represented by the aforesaid formula (3) include methyltrimethoxysilane, methyltriethoxysilane, methyltripropoxysilane, methyltributoxysilane, ethyltrimethoxysilane, propyltrimethoxysilane, and butyltrimethoxysilane. The component (b1) is most preferably methyltrimethoxysilane.

The epoxytrialkoxysilane (b2) is a trialkoxysilane having an epoxy-containing organic group. The component (b2) is particularly a compound which is represented by the aforesaid formula (3) and in which a group represented by $R^2$ is substituted with an epoxy-containing organic group. The epoxy-containing organic group is as described above.

The epoxytrialkoxysilane preferably has an alicyclic hydrocarbon group preferably having an epoxy group, particularly a group represented by the following formulas (2) to (5).

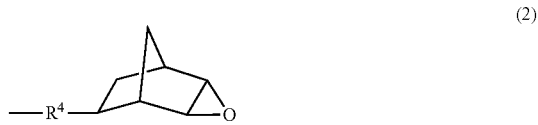

(2)

(3)

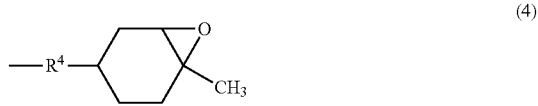

(4)

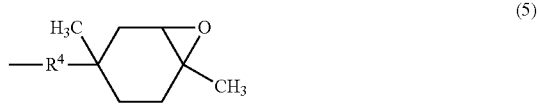

(5)

In the aforesaid formulas, $R^4$ is, independently of each other, a single bond or a divalent hydrocarbon group having 1 to 6 carbon atoms, preferably a divalent hydrocarbon group having 2 to 4 carbon atoms.

A mass ratio of the organotrialkoxysilane (b1) to the epoxytrialkoxysilane (b2), that is, a ratio [the mass of the organotrialkoxysilane (b1)]:[the mass of the epoxytrialkoxysilane(b2)] is preferably 99:1 to 50:50, more preferably 99:1 to 80:20. If the amount of component (b2) is too large, the particles may not powder and is therefore not preferred.

The total amount of the organotrialkoxysilane (b1) and the epoxytrialkoxysilane (b2) to be added to the spherical silicone rubber fine particle is preferably 20 parts by mass or less, relative to 100 parts by mass of the water of the aqueous dispersion of the spherical silicone rubber fine particle. If the amount of the components (b1) and (b2) is too large, lumpy products may appear, which is not preferred. Too hard stirring at the hydrolysis and condensation is likely to cause aggregation or fusion bonding between particles particularly when the amount of the organotrialkoxysilane is large. Stirring is therefore conducted under conditions as mild as possible. A propeller blade and a flat-plate blade are usually suited as a stirring device. The reaction temperature of hydrolysis and condensation is preferably in a range of 0 to 60° C., particularly in a range of 5 to 20° C. If the reaction temperature is lower than 0° C., the liquid solidifies. If the temperature is higher than 60° C., particles composed solely of the resulting polyorganosilsesquioxane may be formed to cause aggregation or fusion bonding between the particles.

At the time of the aforesaid hydrolysis and condensation, the alkaline substance or alkaline aqueous solution may be added simultaneously with the organotrialkoxysilane (b1) and the epoxytrialkoxysilane (b2) or sequentially. When the amount of the organotrialkoxysilane (b1) and the epoxytrialkoxysilane (b2) is large, the alkaline substance or alkaline aqueous solution is added preferably in advance to the aqueous dispersion of spherical silicone rubber fine particle. The organotrialkoxysilane (b1) and the epoxytrialkoxysilane (b2) may be simultaneously added to the reaction system. However, when their amount is large, simultaneous addition may cause aggregation or fusion between the particles. Therefore, they are preferably added over time in small portions.

It is recommended to continue the stirring during the hydrolysis and condensation for a while after the addition of the aforesaid components (b1) and (b2) until the hydrolysis and condensation are completed. The hydrolysis and condensation may be completed by heating or if necessary, an acidic substance may be added for neutralization. On account of this, an epoxy group-containing polyorganosilsesquioxane is formed on the surface of the spherical silicone rubber fine particle. In other words, silicone spherical fine particles coated with the epoxy group-containing polyorganosilsesquioxane are obtained. After completion of the reaction, the dispersion is concentrated, for example, by heating and dehydration, filtration, centrifugation, or decantation, washing the concentrate with water if necessary, and removing water by heating and drying at normal pressure or under reduced pressure, spray drying of the dispersion into an air stream, or heating and drying with a fluid heating medium. When the silicone fine particles thus obtained are slightly aggregated, they may be crushed using a grinder such as jet mill, ball mill, or hammer mill.

Thermosetting Resin Composition

The present invention further provides a thermosetting resin composition comprising the epoxy-modified silicone fine particles. The amount of the epoxy-modified silicone fine particles is preferably 0.5 to 30 parts by mass, more preferably 2 to 20 parts by mass, relative to 100 parts by mass of a thermosetting resin. The amount of the epoxy-modified silicone fine particles is preferably 0.5 to 20 mass %, more preferably 2 to 15 mass %, relative to a total mass of the thermosetting resin composition. When the silicone fine particles of the present invention are added to the thermosetting resin composition in the aforesaid range, a cured product having softness derived from the silicone rubber is obtained. Further, the silicone fine particles do not aggregate in the resulting thermosetting resin composition and have good adhesion with the thermosetting resin.

The thermosetting resin is a compound having a reactive functional group which forms a crosslinked structure to cure a resin layer. Examples of the thermosetting resin include acrylate compounds, epoxy compounds, bismaleimide compounds, cyanate compounds, and phenolic compounds. Among them, at least one selected from the group consisting of acrylate compounds, epoxy compounds, bismaleimide compounds, and phenolic compounds is preferred from the standpoint of the viscosity of the resin layer and the coefficient of thermal expansion of a cured product obtained from the thermosetting composition. Further preferred are at least one selected from the group consisting of acrylate compounds, epoxy compounds, and bismaleimide compounds; and at least one selected from the group consisting of acrylate compounds and epoxy compounds is more preferred from the standpoint of a curing rate. These thermosetting resins may be used alone or in combination of two or more. Epoxy resins are particularly preferred.

The epoxy resin is not particularly limited but may be any epoxy resin generally used for thermosetting resin compositions, particularly epoxy resin compositions for encapsulating material. Examples of the epoxy resin include, as well as phenol novolac type epoxy resins, orthocresol novolac type epoxy resins, and epoxy resins having a triphenylmethane skeleton, those obtained by the epoxidation of a novolac resin obtained by the condensation or co-condensation between a phenol such as phenol, cresol, xylenol, resorcin, catechol, bisphenol A, or bisphenol F and/or a naphthol such as α-naphthol, β-naphthol, or dihydroxynaphthalene and an aldehyde group-containing compound such as formaldehyde, acetaldehyde, propionaldehyde, benzaldehyde, or salicylaldehyde in the presence of an acidic catalyst (novolac type epoxy resins); diglycidyl ethers of bisphenol A, bisphenol F, or bisphenol S (bisphenol type epoxy resins); diglycidyl ethers of an alkyl-substituted or -unsubstituted bisphenol (biphenyl type epoxy resins); stilbene type epoxy resins; hydroquinone type epoxy resins; glycidyl ester type epoxy resins obtained by the reaction of a polybasic acid such as phthalic acid or dimer acid and epichlorohydrin; glycidylamine type epoxy resins obtained by the reaction of a polyamine such as diaminodiphenylmethane or isocyanuric acid and epichlorohydrin; epoxidation products of a co-condensation resin of dicyclopentadiene and a phenol (dicyclopentadiene type epoxy resins); naphthalene ring-containing epoxy resins (naphthalene type epoxy resins); aralkyl type phenolic resins synthesized from a phenol and/or a naphthol and dimethoxyparaxylene or bis(methoxymethyl)biphenyl; epoxidation products of an aralkyl type phenolic resin such as naphthol-aralkyl resin; trimethylolpropane type epoxy resins; terpene-modified epoxy resins; linear aliphatic epoxy resins obtained by oxidizing an olefinic bond with a peroxy acid such as peracetic acid; alicyclic epoxy resins; and sulfur atom-containing epoxy resins. These epoxy resins may be used alone or in combination thereof.

The amount of the thermosetting resin in the thermosetting resin composition is not particularly limited and is, for example, preferably 30 mass % or more, more preferably 40 mass % or more, relative to the mass of the solid amount of the thermosetting resin composition from the standpoint of obtaining sufficient curability. The amount of the thermosetting resin is, for example, preferably 99 mass % or less, more preferably 95 mass % or less, further preferably 70 mass % or less, relative to the mass of the solid amount of the resin layer or the thermosetting resin composition, from the standpoint of the fluidity of the resin layer.

The thermosetting resin composition further preferably comprises a curing agent. The curing agent may be any curing agent generally used for a thermosetting resin composition, particularly, an epoxy resin composition for encapsulating material and is not particularly limited. Examples of curing agent include novolac type phenolic resins obtained by the condensation or co-condensation between a phenol such as phenol, cresol, resorcin, catechol, bisphenol A, bisphenol F, phenylphenol, or aminophenol and/or a naphthol such as α-naphthol, β-naphthol, or dihydroxynaphthalene and an aldehyde group-containing compound such as formaldehyde, benzaldehyde, or salicylaldehyde in the presence of an acidic catalyst; phenol-aralkyl resins synthesized from a phenol and/or a naphthol and dimethoxyparaxylene or bis(methoxymethyl)biphenyl; aralkyl type phenolic resins such as naphthol-aralkyl resins; copolymer type phenol-aralkyl resins in which a phenol-novolac structure and a phenol-aralkyl structure are repeated at random, in block, or alternately; paraxylylene and/or metaxylylene-modified phenolic resins; melamine-modified phenolic resins; terpene-modified phenolic resins; dicyclopentadiene type phenolic resins; cyclopentadiene type phenolic resins; and polycyclic aromatic ring-modified phenolic resins. These curing agents may be used alone or in combination thereof.

The thermosetting resin composition of the present invention may further comprise a curing accelerator for accelerating the curing reaction of the thermosetting resin and the curing agent, and an inorganic filler such as fused silica, crystalline silica, alumina, boron nitride, aluminum nitride, silicon nitride, magnesia, magnesium silicate, and aluminum. Further, any known additives for a thermosetting resin composition may be incorporated as far as it does not detract the effects of the present invention.

A method for preparing the thermosetting resin composition of the present invention may be any known manner. For example, the thermosetting resin composition is obtained by mixing the aforesaid components in a known manner. The thermosetting resin composition comprising the epoxy-modified silicone fine particles according to the present invention, particularly preferably the epoxy resin composition is excellent as an encapsulating material from the standpoint of stress relaxation. The thermosetting resin composition of the present invention is therefore useful as an encapsulating material for a semiconductor element. The thermosetting resin composition is applied to an object such as an electronic circuit substrate, for example, by a known method of application and suitably used as an encapsulating material.

EXAMPLES

The present invention will hereinafter be described more specifically with reference to the following Examples and Comparative Examples, but the present invention is not limited by the following Examples. In the following Examples, "part" or "parts" and "%" mean part or parts by mass and mass %, respectively.

(A) Preparation of Spherical Silicone Rubber Fine Particle

Preparation Example A1

280 Grams of methylvinylsiloxane represented by the following formula (1) (kinematic viscosity: 8.5 mm$^2$/s, vinyl value: 0.21 (mol/100 g)) and 80 g of methylhydrogenpolysiloxane represented by the following formula (2) (kinematic viscosity: 121 mm$^2$/s, H value: 0.85 mol/100 g) were placed in a 1 L glass beaker and stirred and mixed by a homomixer at 2,000 rpm. Then, 1.1 g of polyoxyethylene lauryl ether (with 9 moles of oxyethylene on average) and 330 g of water were added. The stirring was continued at 6,000 rpm and, then, phase inversion occurred, which caused thickening. 940 Grams of dilution water was poured to the thickened mixture and, then, the diluted mixture was subjected to homozination with a high-pressure homogenizer twice at a pressure of 300 BAR to obtain an O/W silicone oil emulsion. 50 Grams of washing water of a high-pressure homogenizer were used.

Then, the resulting silicone oil emulsion was transferred to a glass flask equipped with a stirring device having an anchor type stirring blade. A mixture of 0.5 g of a solution of a chloroplatinic acid-olefin complex in toluene (platinum content: 0.5%) and 1.2 g of polyoxyethylene lauryl ether (with 9 moles of oxyethylene added on average) was added at room temperature under stirring and the resulting mixture was reacted for 12 hours to obtain an aqueous dispersion of spherical silicone rubber fine particles (hereinafter referred to as "Aqueous dispersion 1 of spherical silicone rubber fine particles"), with a solid content of about 21%. The spherical silicone rubber fine particles had a volume average particle diameter of 2.5 μm. Several grams of the dispersion was dried at room temperature to obtain white elastic rubber powders.

The hardness of the rubber composed of the silicone rubber spherical particles was determined in the following manner.

Methylvinylpolysiloxane represented by the following formula (1), methylhydrogenpolysiloxane represented by the following formula (2), and a solution of a platinum-olefin complex in toluene (platinum content: 0.5%) were mixed at the aforesaid mixing ratio and the resulting mixture was cast in an aluminum petri dish to give a thickness of 10 mm. The mixture was left at 25° C. for 24 hours and, then, heated in a thermostatic chamber of 50° C. for one hour to obtain a silicone rubber. The rubber hardness determined by a durometer A was 75.

Preparation Example A2

512 Grams of methylvinylsiloxane represented by the following formula (1) (kinematic viscosity: 8.5 mm$^2$/s, vinyl value: 0.21 (mol/100 g)) and 144 g of methylhydrogenpolysiloxane represented by the following formula (2) (kinematic viscosity: 121 mm$^2$/s, H value: 0.85 mol/100 g) were placed in a 1 L glass beaker and stirred and mixed by a homomixer at 2,000 rpm. Then, 3.7 g of NIKKOL BB-10, 5.6 g of NIKKOL BB-20, and 312 g of water were added. The stirring was continued at 6,000 rpm and, then, phase inversion occurred, which caused thickening. 1375 Grams of dilution water was poured to the thickened mixture and, then, the diluted mixture was subjected to a high-pressure homogenizer twice at a pressure of 400 BAR to obtain an O/W silicone oil emulsion. 900 Grams of the washing water of the high-pressure homogenizer was used.

Then, the resulting emulsion was transferred to a glass flask equipped with a stirring device having an anchor type stirring blade. A mixture of 1.9 g of a solution of a chloroplatinic acid-olefin complex in toluene (platinum content: 0.5%) and 1.9 g of NIKKOL BB-10 was added at room temperature under stirring and the resulting mixture was reacted for 15 hours to obtain an aqueous dispersion of spherical silicone rubber fine particles (hereinafter referred to as "Aqueous dispersion 2 of spherical silicone rubber fine particles"). The resulting aqueous dispersion had a solid content of about 20%. The spherical silicone rubber fine particles had a volume average particle diameter of 0.8 μm. Several grams of the dispersion was dried at room temperature to be yielded white elastic rubber powder.

The hardness of the rubber composed of the silicone rubber spherical particles was determined in the following manner. Methylvinylpolysiloxane represented by the following formula (1), methylhydrogenpolysiloxane represented by the following formula (2), and a solution of a platinum-olefin complex in toluene (platinum content: 0.5%) were mixed at the aforesaid mixing ratio and the resulting mixture was cast in an aluminum Petri dish to give a thickness of 10 mm. The mixture was left at 25° C. for 24 hours and, then, heated in a thermostatic chamber of 50° C. for one hour to obtain a silicone rubber. The rubber hardness determined by a durometer A was 75.

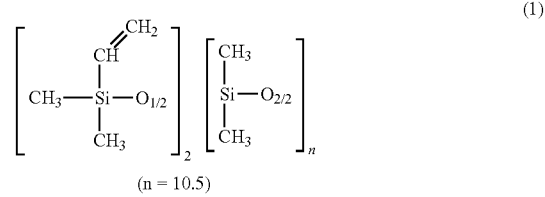

(1)

(n = 10.5)

-continued

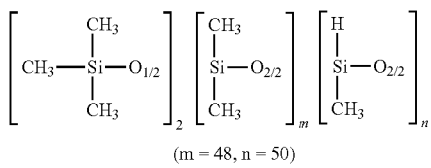

(2)

(m = 48, n = 50)

Preparation of Epoxy-Modified Silicone Fine Particles

Example 1

54.3 Grams of water, 296 g of the aqueous dispersion of spherical silicone rubber fine particles obtained in the Preparation Example A1 (solid content: about 21%), and 42 g of aqueous ammonia (25 wt % solution of ammonia in water) were placed in a 500 mL glass flask and stirred with an anchor type stirring blade at the number of blade revolutions of 200 rpm while adjusting a water temperature to 10° C. The dispersion at that time had a pH of 12.7. A uniform mixture of 7.3 g of methyltrimethoxysilane and 0.4 g of 2-(3,4-epoxycyclohexyl)ethyltrimethoxysilane was added dropwise to the dispersion over 20 minutes while keeping the liquid temperature at 5 to 15° C. and the stirring was continued for further one hour. The reaction mixture was then heated to 55 to 60° C., the stirring was continued for further one hour, and the reaction mixture was subjected to filtration with a suction filter to obtain a cake. The cake was dried at 55° C. for 16 hours or more and crushed by a jet mill to obtain epoxy-modified silicone fine particles.

Examples 2 to 6 and Comparative Examples 1 to 5, 13 and 14

The procedures of the aforesaid Preparation Example 1 were repeated, except that the components and their amounts were as shown in the following Table 1, to thereby prepare epoxy-modified silicone fine particles. The shape of the silicone fine particles thus obtained, the epoxy equivalent on the surface of the particles, and the volume average particle diameter of the silicone fine particles are shown in Table 1. The average particle diameter and the epoxy equivalent on the surface of the particles were determined according to the following manners.

[Determination of a Particle Diameter]

The particle diameter of the epoxy-modified silicone fine particles was determined using a laser diffraction particle size distribution analyzer by determining a refractive index in methanol. For the fine particles composed solely of silicone rubber, water was used for the determination.

[Determination of an Epoxy Equivalent on the Surface Of Particles]

The epoxy equivalent on the surface of the epoxy-modified silicone fine particles was determined by potentiometric titration. Specifically, the functional group of a test specimen was chlorinated with excessive hydrochloric acid, followed by titration with an alkaline reagent so as to determine the amount of unreacted hydrochloric acid and, thus, determine the amount of the functional group (epoxy group) in the test specimen.

TABLE 1

| Part by weight | Example | | | | | | Comparative Example | | | | | | |
|---|---|---|---|---|---|---|---|---|---|---|---|---|---|
| | 1 | 2 | 3 | 4 | 5 | 6 | 1 | 2 | 3 | 4 | 5 | 13 | 14 |
| (b1) Methyltrimethoxy siloxane | 95 | 90 | 50 | 95 | 90 | 50 | 100 | 100 | 0 | 0 | 0 | 90 | 50 |
| (b2) 2-(3,4-Epoxy cyclohexyl) ethyltrimethoxysilane | 5 | 10 | 50 | 5 | 10 | 50 | 0 | 0 | 100 | 0 | 0 | — | — |
| (b2) 3-Glycidyloxypropyl trim ethoxy silane | — | — | — | — | — | — | — | — | — | — | — | 10 | 50 |
| Aqueous dispersion of spherical silicone rubber fine particles (2.5 µm) of Preparation Example A1, solid content of about 21% | 3848 | 3848 | 3848 | — | — | — | 3848 | — | 3848 | 100 | — | 3848 | 3848 |
| Aqueous dispersion of spherical silicone rubber fine particles (0.8 µm) of Preparation Example A2, solid content of about 20% | — | — | — | 2227 | 2227 | 2227 | — | 2227 | — | — | 100 | — | — |
| Ion exchanged water | 706 | 706 | 706 | 1629 | 1629 | 1629 | 1143 | 2020 | 706 | — | — | 706 | 706 |
| 25% Aqueous ammonia | 546 | 546 | 546 | 489 | 489 | 489 | 109 | 98 | 546 | — | — | 546 | 546 |
| pH of the silicone rubber particles/aqueous dispersion/ion exchanged water/aqueous ammonia | 12.6 | 12.5 | 12.5 | 12.6 | 12.7 | 12.8 | 12.1 | 11.9 | 12.8 | — | — | 12.7 | 12.7 |
| Average particle diameter, µm | 2.6 | 2.3 | 2.7 | 1.1 | 1.0 | 1.2 | 2.3 | 0.9 | *Note | 2.5 | 0.8 | 2.8 | 2.7 |
| Epoxy equivalent, g/mol | 88340 | 33071 | 13976 | 28477 | 19371 | 3866 | 0 | 0 | 0 | 0 | 0 | 45213 | 14757 |

Note)
The silicone fine particles formed a film and did not powder.

Preparation of a Thermosetting Resin Composition

Examples 9 to 16 and Comparative Examples 6 to 12

The epoxy resin, the curing agent, and the silicone fine particles obtained in the aforesaid Examples were mixed according to the composition and the amount shown in the following Table 2 or Table 3 to obtain a thermosetting resin composition. The resulting thermosetting resin composition was cured by the method described below. The cured product thus obtained was evaluated by a bending test and an adhesion test. The results are shown in Tables 2 and 3. The results of the Examples using the spherical silicone rubber fine particle which was obtained in Preparation Example A1 and has an average particle diameter of 2.5 μm are shown in Table 2. The results of the Examples using the spherical silicone rubber fine particle which was obtained in Preparation Example A2 and has an average particle diameter of 0.8 μm are shown in Table 3.

The viscosity of a mixture of the epoxy resin and the silicone fine particles was determined by the following method.

The epoxy resin and the curing agent used in the Examples and Comparative Examples are as follows.

A mixture of a bisphenol A type epoxy resin and a bisphenol F type epoxy resin:
ZX-1059 (epoxy equivalent: 160 to 170, viscosity (25° C.): 1900 to 2600 mPa·s, ex NIPPON STEEL Chemical & Material).

An aromatic amine catalyst represented by the following formula: KAYAHARD A-A (ex Nippon Kayaku)

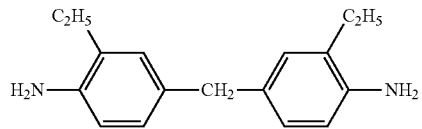

The determination methods and conditions are as follows.

[Viscosity]

The epoxy resin ZX-1059 and the silicone fine particles were mixed in the ratio shown in Table 2 or 3 and the viscosity of the resulting mixture was determined by a BM type viscometer with a rotor No. 3 at 6 rpm and 25° C. As the viscosity is lower, compatibility with the epoxy resin is better.

[Bending Test]

The thermosetting resin composition was stirred for 10 minutes, subjected to vacuum deaeration at 60° C. and poured in a 4 mm-thick mold. The mold was heated at 150° C. for 4 hours, then cooled and opened. The cured product thus obtained was cut into the following size with a diamond cutter. A bending test of the resulting piece was conducted at 25° C. to determine a bending strength (MPa) and a bending modulus of elasticity (MPa). The bending test was conducted by an autograph (ex Shimadzu Corporation) according to JIS-K7171.

The following were test conditions:
a distance of 64 mm between supports, a bending rate of 2 mm/min, and a sample thickness of 4 mm.

[Adhesion]

A part of the cross-section of the test piece obtained above by cutting the 4 mm-thick cured product with a diamond cutter was photographed by SEM with magnification of 3,000 to 10,000 times (an area of about 1800 μm² at magnification of 3000 times, an area of about 850 μm² at magnification of 5000 times, and an area of about 200 μm² at magnification of 10000 times).

Figure 2:
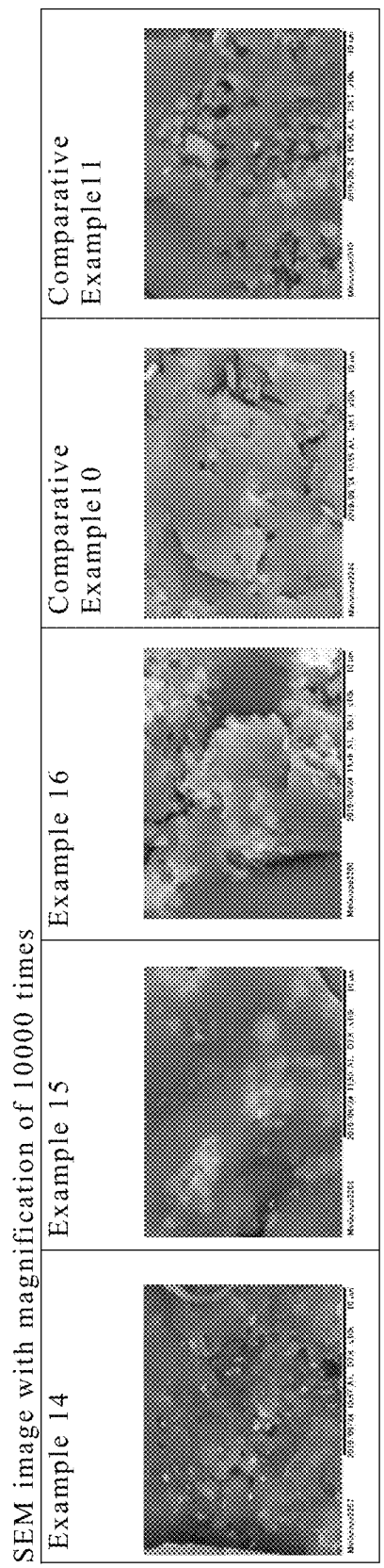
FIG. 2 is an SEM image of the cross-section of a cured product obtained in Examples 14, 15, and 16 and Comparative Examples 10 and 11.

The SEM images of the cut surfaces of the cured products obtained in Examples 9, 10, 13, 14, 15, and 16 and Comparative Examples 6, 9, 10, and 11 are shown in FIGS. 1 and 2. Enlarged SEM images of Example 9 and Comparative Example 6 are shown in FIG. 3. The silicone fine particle which remains in the cut surface of the resin is surrounded with a solid circle line. The place from which particle not bonded by the resin were left out is surrounded with a dotted circle line. As shown in FIGS. 1 to 3, where the silicone fine particle is dropped from the resin, the cut surface inevitably have concaves. On the visual observation of the SEM images, the number of the concaves is counted as the number of the detached particles (the number of particles not bonding to the resin). The number of the particles which remain on the cut surface is counted as the number of the remaining particles (the number of particles which adhere or bond to the resin).

The percentage (%) of the remaining particles is calculated by the following equation: [(the number of remaining particles)/{(the number of remaining particles)+(the number of detached particles)}]

The results are shown in Tables 2 and 3. As the percentage is larger, the adhesion is higher.

TABLE 2

|  | Example | | | | | Comparative Example | | | |
| --- | --- | --- | --- | --- | --- | --- | --- | --- | --- |
|  | 9 | 10 | 11 | 12 | 13 | 6 | 7 | 8 | 9 |
| Epoxy resin | 72 | 72 | 72 | 72 | 72 | 72 | 72 | 72 | 72 |
| Aromatic amine-based catalyst | 28 | 28 | 28 | 28 | 28 | 28 | 28 | 28 | 28 |
| Silicone fine particles of Example 1 | 8 | | | | | | | | |
| Silicone fine particles of Example 2 | | 8 | 4 | 2 | | | | | |
| Silicone fine particles of Example 3 | | | | | 8 | | | | |
| Silicone fine particles of Comparative Example 1 | | | | | | 8 | 4 | 2 | |
| Silicone fine particles of Comparative Example 4 | | | | | | | | | 8 |
| Bending strength, MPa | 86 | 95 | 77 | 109 | 81 | 92 | 105 | 111 | 65 |
| Bending modulus of elasticity, MPa | 2253 | 2264 | 2473 | 2582 | 2242 | 2184 | 2462 | 2569 | 2229 |
| Viscosity of a mixture of ZX-1059 and silicone fine particles, Pas | 3.34 | 3.63 | 2.66 | 2.35 | 5.19 | 4.59 | 2.89 | 2.25 | 13.57 |
| Adhesion test, percentage, %, of the remaining particles | 46.7 | 55.5 | 57.8 | 58.2 | 52.6 | 8.1 | 8.4 | 8.7 | 28.5 |

TABLE 3

| | Example | | | Comparative Example | | |
|---|---|---|---|---|---|---|
| | 14 | 15 | 16 | 10 | 11 | 12 |
| Epoxy resin | 72 | 72 | 72 | 72 | 72 | 72 |
| Aromatic amine-based catalyst | 28 | 28 | 28 | 28 | 28 | 28 |
| Silicone fine particles of Example 4 | 8 | | | | | |
| Silicone fine particles of Example 5 | | 8 | | | | |
| Silicone fine particles of Example 6 | | | 8 | | | |
| Silicone fine particles of Comparative Example 2 | | | | 8 | | |
| Silicone fine particles of Comparative Example 5 | | | | | 8 | |
| Bending strength, MPa | 93 | 98 | 80 | 96 | 73 | 122 |
| Bending modulus of elasticity, MPa | 2278 | 2253 | 2360 | 2162 | 2229 | 2686 |
| Viscosity of a mixture of ZX-1059 and silicone fine particles, Pas | 4.52 | 5.07 | 4.62 | 7.85 | 6.28 | 1.87 |
| Adhesion test, percentage, %, of the remaining particles | 58.1 | 74.8 | 44.1 | 19.2 | 46.2 | — |

As shown in the Examples in the aforesaid Tables 2 and 3, the viscosities in the cases of epoxy-modified silicone fine particles of the present invention are low. This suggests the enhancement of the compatibility between the silicone fine particles and the epoxy resin. Thus, the silicone fine particles do not aggregate in the epoxy resin and well dispersed therein, so that the mixture with the epoxy resin has an adequate viscosity. In addition, the cured product of the resin composition comprising the silicone fine particles according to the present invention shows a high proportion of the remaining particles in the adhesion test and, the less number of the silicone fine particles are left out in the cutting of the test piece. This shows that the silicone fine particles have excellent adhesion with the epoxy resin. Further, the cured product thus obtained has excellent mechanical properties such as the bending strength and the bending modulus of elasticity. In contrast, the silicone fine particles of Comparative Examples 1, 2, and 4 are inferior in adhesion with the epoxy resin as shown in Comparative Examples 6 to 9 and 10. The silicone fine particles of Comparative Example 5 have a small particle diameter and therefore are not inferior in adhesion as shown in Comparative Example 11, but the particles aggregate in the resin, which is not preferred. In Comparative Example 9, the mixture of the silicone fine particles with the epoxy resin has a high viscosity and, therefore, the silicone fine particles are inferior in dispersibility in the epoxy resin composition.

INDUSTRIAL APPLICABILITY

The epoxy-modified silicone fine particles of the present invention have softness derived from the silicone rubber and do not aggregate and therefore have excellent dispersibility in a thermosetting resin, particularly an epoxy resin. In addition, they are excellent in adhesion with a thermosetting resin, particularly, an epoxy resin. Further, a thermosetting resin composition and an encapsulating material comprising the epoxy-modified silicone fine particles provides a cured product having excellent in mechanical properties such as a bending strength and a bending modulus of elasticity. The present thermosetting resin composition is useful as an encapsulating material for a semiconductor element. For example, the present thermosetting resin composition may be applied on an object such as an electronic circuit substrate by a known application method and suited for use as an encapsulating material.

The invention claimed is:

1. Epoxy-modified silicone fine particle composed of (A) a spherical silicone rubber fine particle coated with (B) polyorganosilsesquioxane, wherein the spherical silicone rubber fine particle (A) has an average particle diameter of 0.1 to 100 um and the polyorganosilsesquioxane (B) has an epoxy group-containing alicyclic hydrocarbon group and an epoxy equivalent of 2,000 to 100,000 g/mol.

2. The epoxy-modified silicone fine particle according to claim 1, wherein the silicone rubber of component (A) comprises a spherical silicone cured product having a linear organopolysiloxane block represented by the following formula (1) in the molecular structure and:

$$—(R^1{}_2SiO)_a— \quad (1)$$

wherein $R^1$ is, independently of each other, a substituted or unsubstituted monovalent hydrocarbon group having 1 to 20 carbon atoms or an organic group having a reactive group selected from the group consisting of epoxy, amino, mercapto, acryloxy and methacryloxy groups, and a is an integer of from 5 to 5000.

3. The epoxy-modified silicone fine particle according to claim 1, wherein an amount of the polyorganosilsesquioxane (B) is 1 to 500 parts by mass, relative to 100 parts by mass of the spherical silicone rubber fine particle (A).

4. The epoxy-modified silicone fine particle according to claim 1, wherein the polyorganosilsesquioxane (B) has a methyl group bonded to a silicon atom, besides the epoxy group-containing alicyclic hydrocarbon group.

5. The epoxy-modified silicone fine particle according to claim 1, wherein the epoxy group-containing alicyclic hydrocarbon group is selected from the groups represented by the following formulas (2) to (5):

(2)

(3)

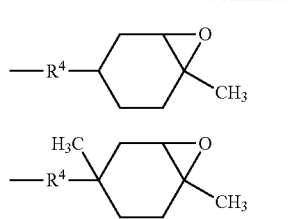

(4)

(5)

wherein $R^4$ is a single bond or a divalent hydrocarbon group having 1 to 6 carbon atoms.

6. A method of preparing the epoxy-modified silicone fine particle according to claim 1, wherein the method comprising a step of subjecting (b1) an organotrialkoxysilane and (b2) an epoxytrialkoxysilane to hydrolysis and condensation reactions in an aqueous dispersion of a spherical silicone rubber fine particle to thereby form an epoxy group-containing polyorganosilsesquioxane on a surface of the spherical silicone rubber fine particle.

7. The method according to claim 6, wherein the hydrolysis and condensation reactions are conducted at a pH in a range of 11.5 to 13.5.

8. A method of preparing an epoxy-modified silicone fine particle composed of (A) a spherical silicone rubber fine particle coated with (B) polyorganosilsesquioxane, wherein the spherical silicone rubber fine particle (A) has an average particle diameter of 0.1 to 100 μm, and the polyorganosilsesquioxane (B) has an epoxy group-containing organic group, the method comprises a step of subjecting (b1) an organotrialkoxysilane and (b2) an epoxytrialkoxysilane to hydrolysis and condensation reactions in an aqueous dispersion of a spherical silicone rubber fine particle at a pH in a range of 11.5 to 13.5, in the presence of aqueous ammonia, and an amount of the aqueous ammonia is 200 to 800 parts by mass as calculated as a 25% solution of ammonia in water, relative to a total 100 parts by mass of components (b1) and (b2) to thereby form an epoxy group-containing polyorganosilsesquioxane on a surface of the spherical silicone rubber fine particle.

9. The method according to claim 6, wherein a ratio of a mass of the organotrialkoxysilane (b1) to a mass of the epoxytrialkoxysilane(b2) is 99:1 to 50:50.

10. A thermosetting resin composition comprising 0.5 to 20 mass % based on an amount of the thermosetting resin composition, of the epoxy-modified silicone fine particle according to claim 1.

11. A cured product obtained by curing the thermosetting resin composition according to claim 10.

12. A semiconductor element encapsulated with the cured product according to claim 11.

13. The method according to claim 7, wherein the hydrolysis and condensation reactions are conducted in the presence of aqueous ammonia, and an amount of the aqueous ammonia is 200 to 800 parts by mass as calculated as a 25% solution of ammonia in water, relative to a total 100 parts by mass of components (b1) and (b2).

14. The method according to claim 8, wherein the organic group of the epoxy group-containing organic group in component (B) is an alicyclic hydrocarbon group.

15. The method according to claim 8, wherein a ratio of a mass of the organotrialkoxysilane (b1) to a mass of the epoxytrialkoxysilane(b2) is 99:1 to 50:50.

16. The epoxy-modified silicone fine particle according to claim 1, wherein the epoxy group-containing alicyclic hydrocarbon group is represented by the following formula (3):

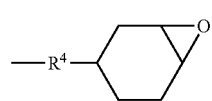

(3)

wherein $R^4$ is a single bond or a divalent hydrocarbon group having 1 to 6 carbon atoms.

* * * * *